United States Patent [19]

Ference et al.

[11] Patent Number: 5,244,143

[45] Date of Patent: Sep. 14, 1993

[54] APPARATUS AND METHOD FOR INJECTION MOLDING SOLDER AND APPLICATIONS THEREOF

[75] Inventors: Thomas G. Ference, Carmel; Peter A. Gruber, Mohegan Lake, both of N.Y.; Bernardo Hernandez, Norwalk, Conn.; Michael J. Palmer, Walden; Arthur R. Zingher, White Plains, both of N.Y.

[73] Assignee: International Business Machines Corporation, Armonk, N.Y.

[21] Appl. No.: 869,676

[22] Filed: Apr. 16, 1992

[51] Int. Cl.$^5$ .............................................. B23K 1/20
[52] U.S. Cl. .............................. 228/180.21; 228/56.3; 228/253; 427/96; 427/282
[58] Field of Search ............................ 164/129, 111, 98; 228/180.2, 253–254, 56.3, 39, 123; 427/96, 259, 282; 118/100, 406, 412, 415; 101/114, 129

[56] References Cited

U.S. PATENT DOCUMENTS

| | | | |
|---|---|---|---|
| 2,672,653 | 3/1954 | Simpkins et al. | 249/96 |
| 2,696,640 | 12/1954 | Wienand | 425/382.4 |
| 2,766,482 | 10/1956 | Heibel | 425/121 |
| 3,384,931 | 5/1968 | Cochran et al. | 164/98 X |
| 3,531,852 | 10/1970 | Slemmons et al. | 228/110 |
| 3,842,488 | 10/1974 | Mitchell | 164/111 X |
| 4,332,343 | 1/1982 | Koopman et al. | 228/180.2 X |
| 4,412,642 | 11/1983 | Fisher, Jr. | 228/173.1 |
| 4,637,542 | 1/1987 | Breske et al. | 228/180.1 |
| 4,705,205 | 11/1987 | Allen et al. | 228/180.2 |
| 4,722,470 | 2/1988 | Johary | 228/180.2 |
| 4,767,344 | 8/1988 | Noschese | 228/180.1 X |
| 4,906,823 | 3/1990 | Kushima et al. | 228/254 X |
| 5,048,747 | 9/1991 | Clark et al. | 228/180.2 |

OTHER PUBLICATIONS

IBM Technical Disclosure Bulletin vol. 21 No. 12, May 1979 p. 4835.
"Molten Solder Applicator Devices", Research Disclosure, Jun. 1988, No. 290, Kenneth Mason Publications Ltd., England.

Primary Examiner—Kenneth J. Ramsey
Attorney, Agent, or Firm—Daniel P. Morris

[57] ABSTRACT

An apparatus and method are described for injection molding solder mounds onto electronic devices. The apparatus has a reservoir for molten solder which is disposed over a cavity in an injection plate. The injection plate is disposed over a mold having an array of cavities therein into which solder in injection molded. The mold is disposed over a workpiece, such as a semiconductor chip or a semiconductor chip packaging substrate. The cavities in the mold are aligned with electrical contact locations on the chip or substrate. The workpiece is heated and the molten solder is forced under gas pressure into the cavity in the injection plate disposed above the array of cavities in the mold. The molten solder is forced into the array of cavities in the mold. The injection plate is advanced to slide over the mold to wipe away the excess solder above the mold at a plurality of wiping apertures in the injection plate. The injection plate is further advanced to a location having a nonsolder wettable surface at which location the injection plate is removed. The mold is then removed to leave solder mounds disposed on the workpiece. The workpiece can be a semiconductor chip, a semiconductor chip packaging substrate or a dummy substrate onto which the injected molded solder adheres such as a polymer layer to form a carrier substrate for a solder mound array which can be subsequently transferred to a substrate such as a semiconductor chip or a semiconductor chip packaging substrate. The apparatus and methods of the present invention can be integrated into an automated manufacturing system for depositing an array of solder mounds onto a substrates.

35 Claims, 12 Drawing Sheets

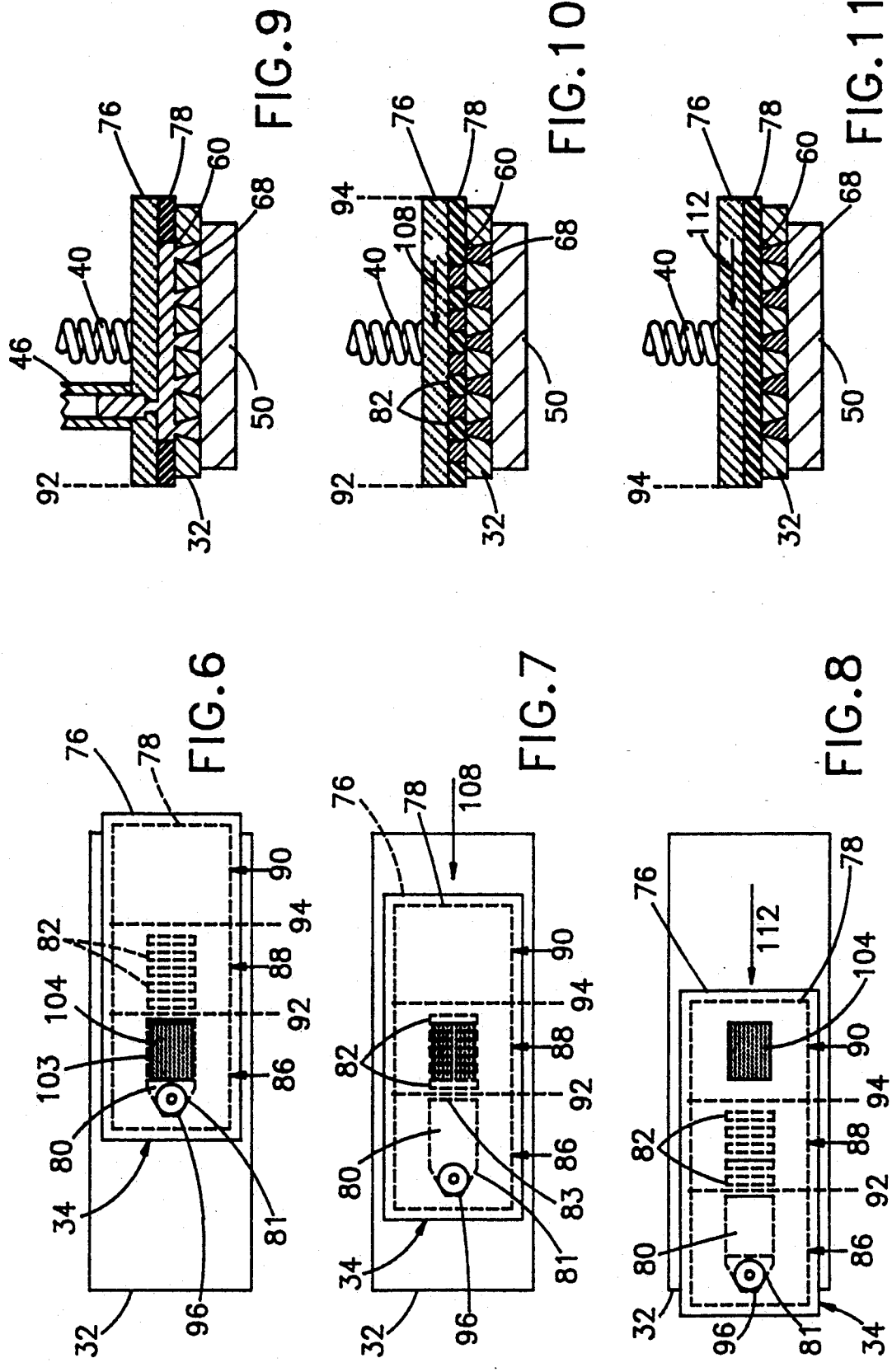

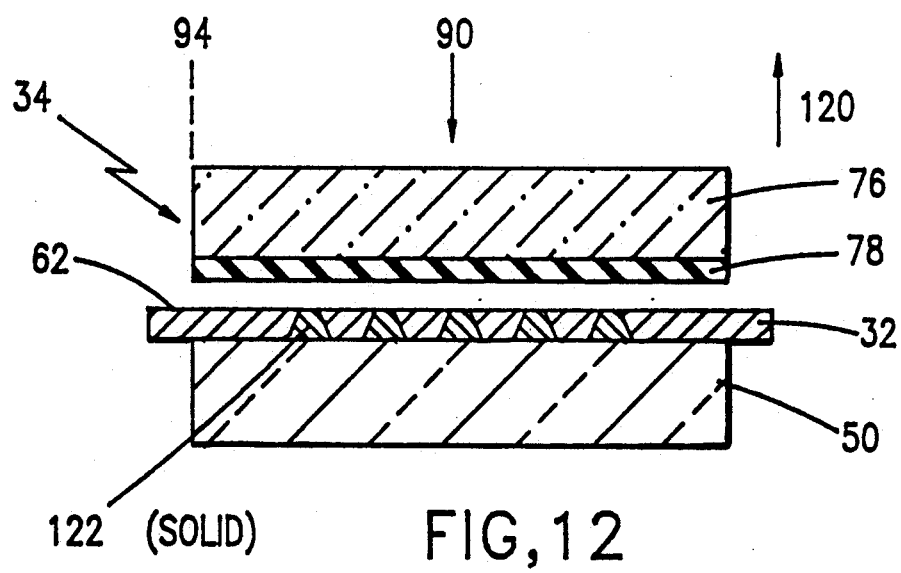
FIG. 12
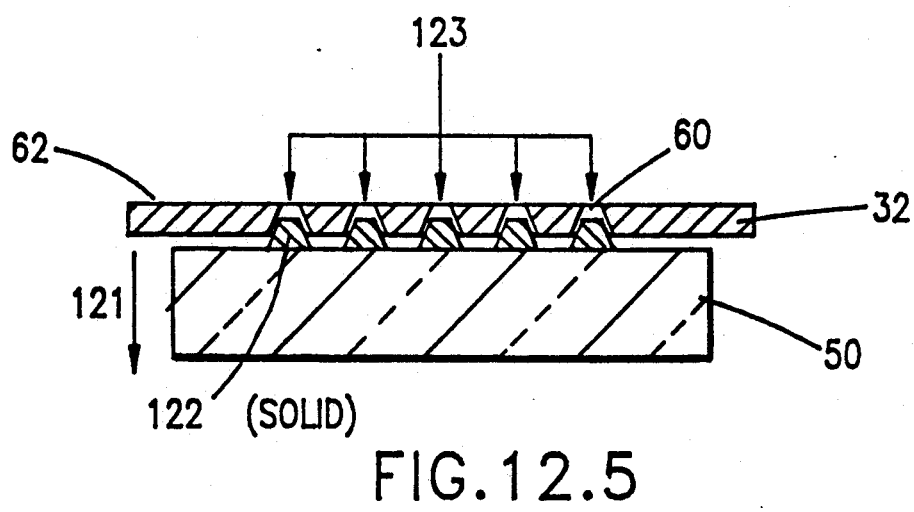
FIG. 12.5
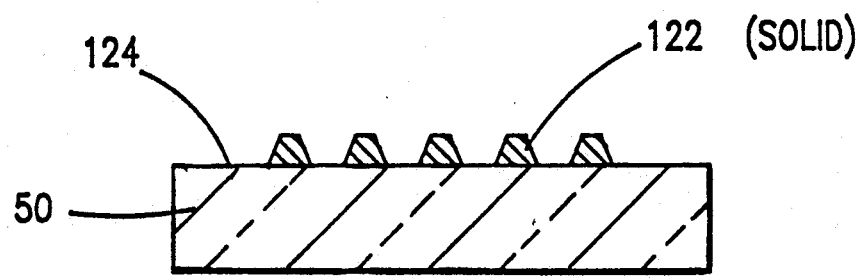
FIG. 13

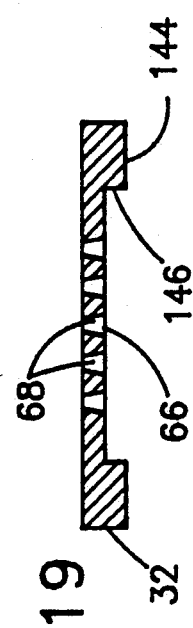
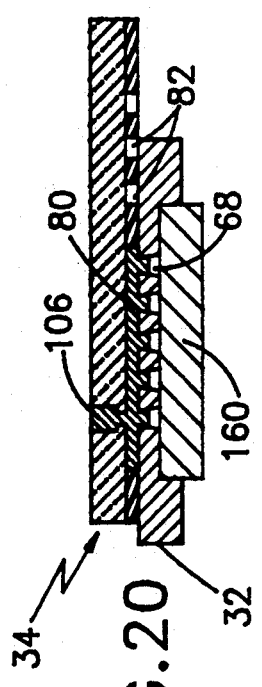
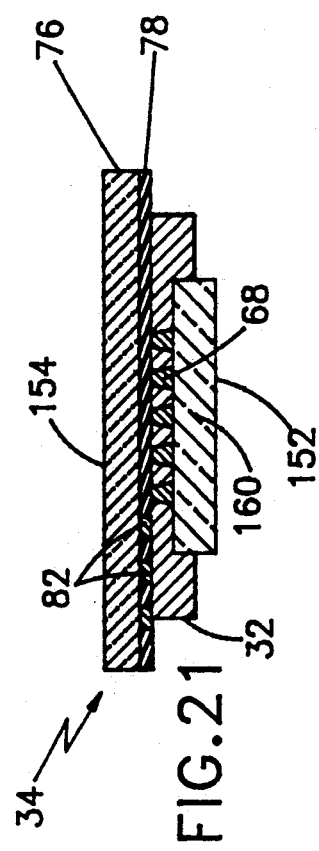
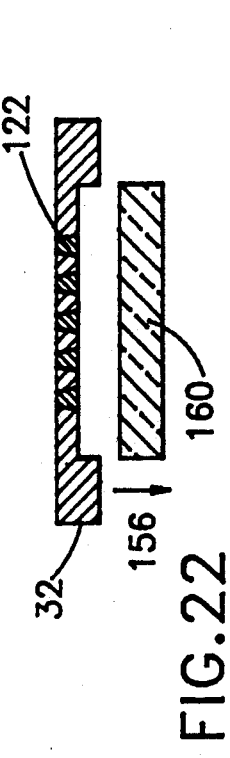
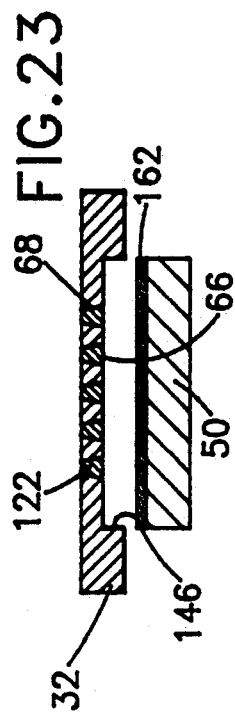
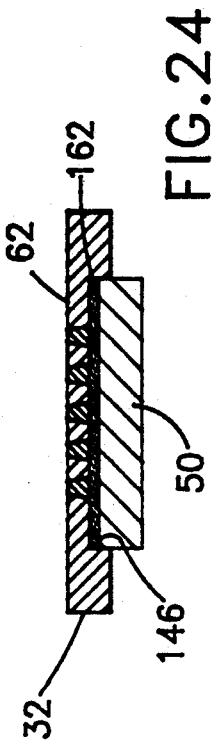
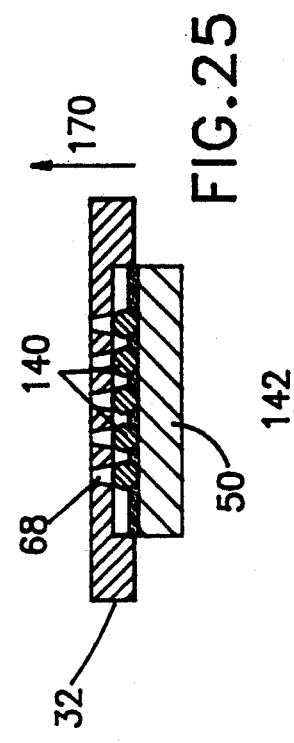
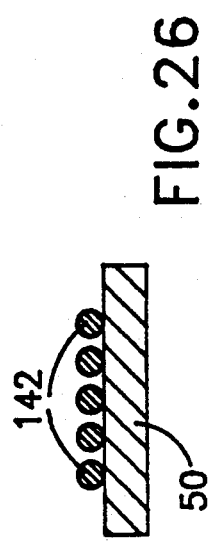

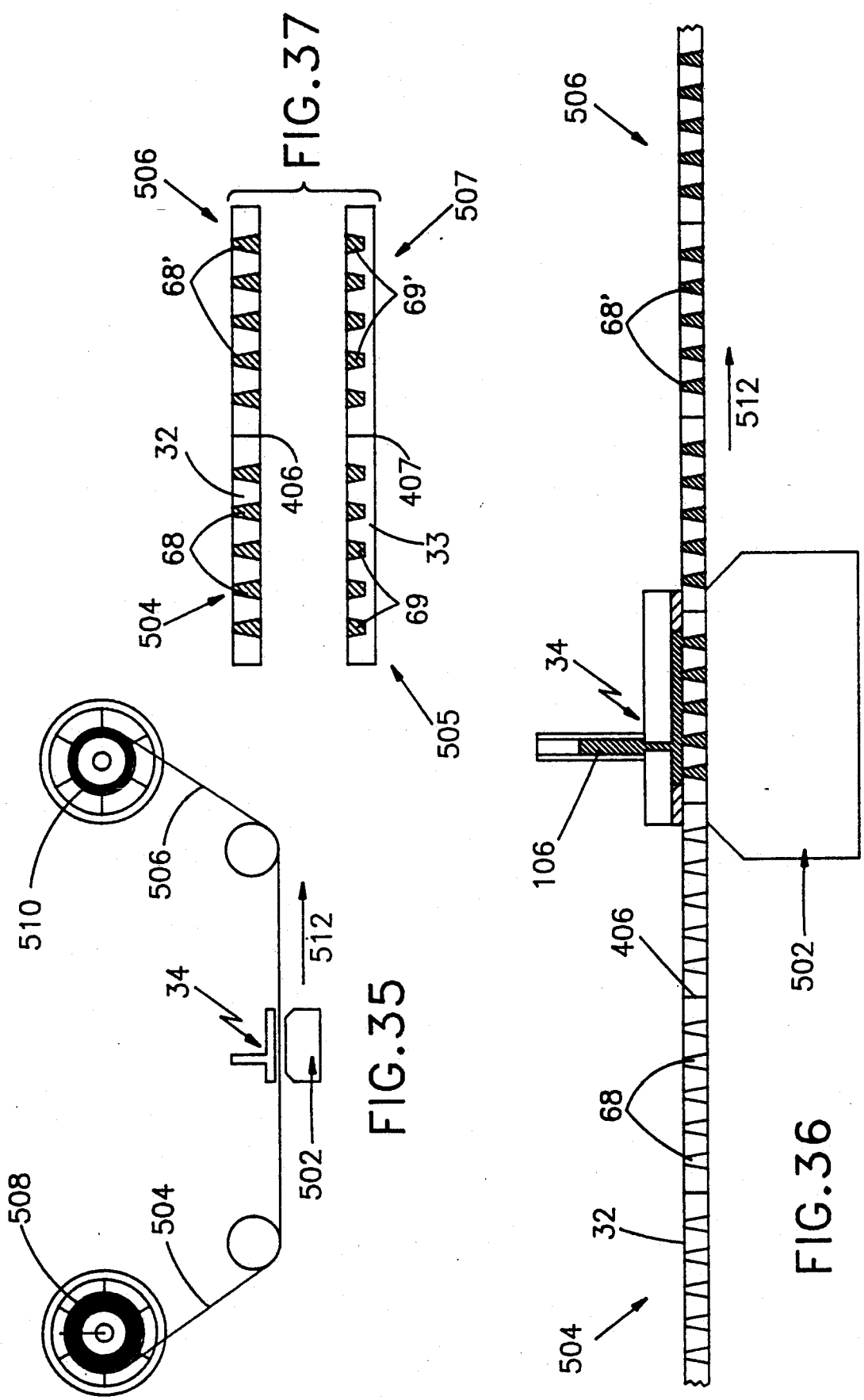

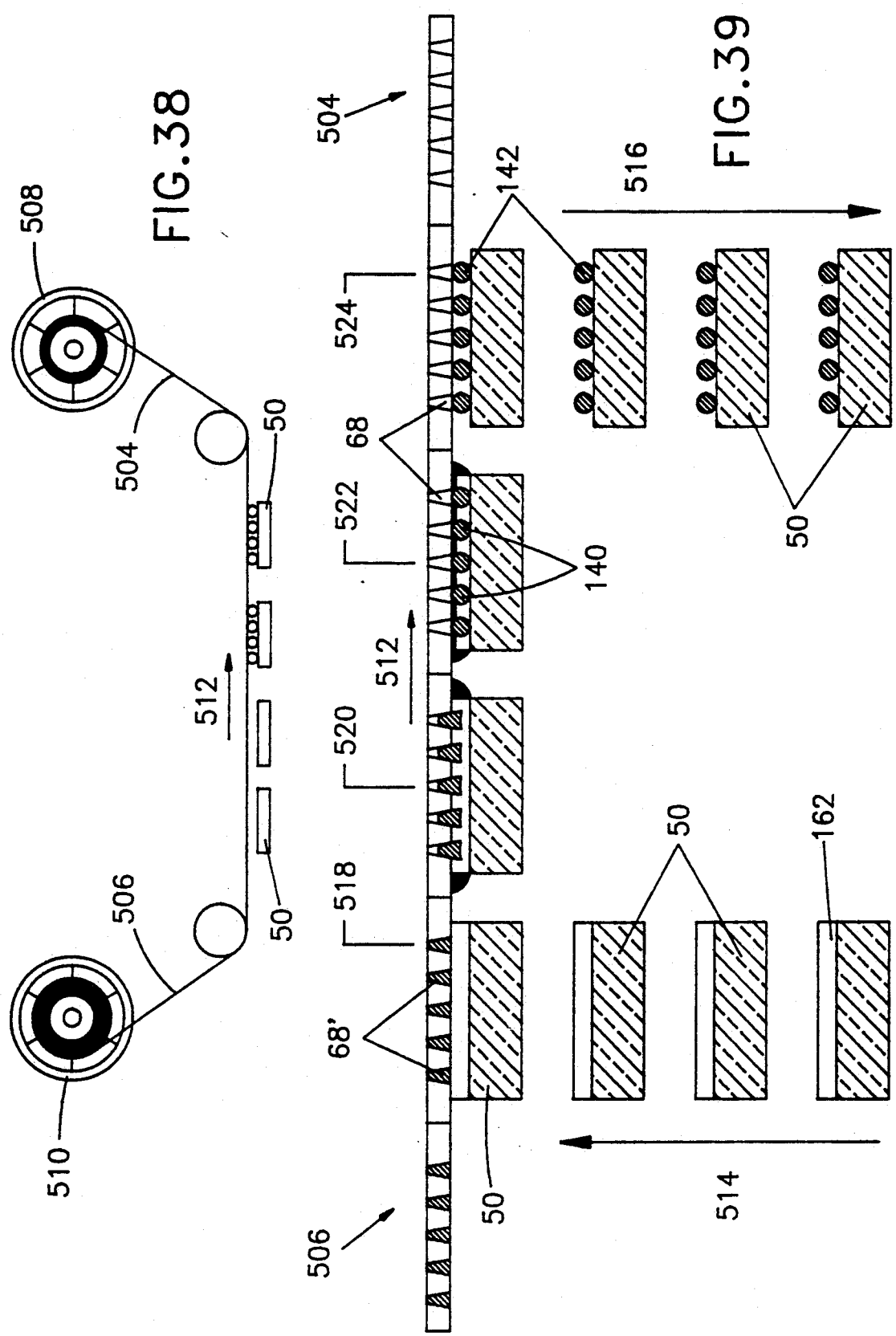

APPARATUS AND METHOD FOR INJECTION MOLDING SOLDER AND APPLICATIONS THEREOF

FIELD OF THE INVENTION

The present invention is directed to an apparatus and method for injection molding solder and to structures formed thereby. More particularly, the apparatus of the present invention, has a reservoir for containing molten solder which is disposed over a plate having a plurality of apertures therein into which the molten solder is forced under pressure to form a plurality of solder regions within the apertures in the plate. The plate is disposed against a substrate, in particular, an electronic substrate. The plate is removed and the solder is allowed to cool leaving a plurality of solder regions disposed on the substrate. More particularly, the plate is formed from a nonsolder wettable material thereby permitting the solder to be cooled while in the plate resulting in a plurality of solder regions molded to the shape of the apertures in the plate. The plate is removed leaving the shaped solder regions on the substrate.

BACKGROUND OF THE INVENTION

In the semiconductor electronics industry, semiconductor chips can be mounted in a flip-chip-configuration with solder balls commonly known as C4 therebetween. The C4 provides an electrical connection and bond between a chip contact location and a substrate contact location. As chip circuit densities increase there is an increased demand for chip I/O. Moreover, if a very large chip is used having a very high density of circuits, a very large number of I/O are required for electrical communication with the chip. The I/O provide signal, power and ground to the chip. As the chip I/O increases, C4s which are solder bonded to the chip contact locations must be smaller and more closely spaced. Moreover, the height of each C4 must be distributed within a relatively small height tolerance to insure that all of the chip contact locations will be electrically interconnected to a corresponding substrate contact location through the C4 bonded therebetween.

Analogous requirements for electronic connections and solder technology also occur at several levels in electronic packaging. This includes solder connections between 1st and 2nd level packages, or 2nd and 3rd level packages. One example is as follows. To connect between a few chips and a large printed circuit board, there is a small printed circuit board, called an interposer. This requires solder connections both between the chip and interposer, and between the interposer and large circuit board. Another example is as follows. To connect between one or a few chips and a large printed circuit board, there is a ceramic package. This uses wire bonds from chip to package, and an area array of solder connections between package an printed circuit board. This ceramic package and chips is sometimes referred to as a hybrid monolithic module. An exemplary list of workpieces suitable for the present invention are: a chip, a substrate, a small printed circuit board, a large printed circuit board, various other electronic packages for various levels, or other electronic device requiring solder connections. Exemplary workpieces include components made of various materials, including but not limited to: semiconductor, ceramic, organic, metallic, crystalline, polycrystalline, polymeric, glassy or amorphous materials.

It is conventional to deposit C4s onto contact locations on a chip or substrate by disposing over the chip or substrate a mask having apertures therein which correspond to the locations of the contact locations on the chip or substrate. The combination of mask and chip are placed into an evaporator which is evacuated. The evaporator contains source materials such as a Pb and Sn. The source is heated to create a vapor of material which deposits upon the mask, filling the apertures therein, and deposits onto the exposed contact locations. Unfortunately, evaporation of C4s do not create very uniform solder heights. Therefore, when there is a very high density of C4s there is a substantial likelihood that a portion of the C4s will not properly electrically interconnect a chip and substrate. Furthermore, solder is evaporated and condensed everywhere in line of sight of the source, leaving orders of magnitude more solder than desired at the pad locations.

Depending on the low vapor pressure and slow deposition rate of the component metals, evaporation may be very time-consuming, and may expose the workpiece to a long time at elevated temperature. The process duration is further increased by the time to load and unload the process vacuum chamber. Injection molding solder has distinct toxicological advantages compared to sputtering or evaporating solder through a stencil. Many solders include lead or other metals which could cause human and environmental damage if they are not contained. During injection molding, almost all the solder is directly and usefully applied to the substrate or other product. There is very little wasted solder, and that is contained in the injection molding system, and can be immediately reused for injection molding. Also solder vapors are fully enclosed and minimized. By sharp contrast, sputtering or evaporation spreads a vastly larger amount of solder throughout a process chamber. Only a small fraction penetrates the mask, and is usefully applied to the substrate or other product. To clean the process chamber and to control the vast excess solder, raises questions of worker safety during cleaning, and environmental safety during disposal or recycling.

It is an object of the present invention to provide an apparatus to deposit onto a substrate solder mounds having substantially uniform height.

The apparatus of the present invention does not require that the workpiece be placed in a vacuum. The apparatus of the present invention deposits solder onto a substrate without requiring that the workpiece be placed in a vacuum.

Moreover, using the apparatus of the present invention, a solder bond having higher aspect ratio (mound height/mound diameter) can be easily fabricated by using an injection mold of appropriate shape.

Moreover, solder mounds having a spatially graded solder composition can be readily fabricated by injecting into a solder mound sequentially solders of different melting temperatures. Thereby, a solder mound can be fabricated which has a relatively low melting point solder at the apex as compared to the solder at the base. If the base is connected to a chip contact location, the solder mound can be heated to the melting temperature of the solder at the mound apex for joining to a contact location on a substrate. By heating only to a melting temperature of the solder of the apex the entire solder mound will not melt and therefore will retain its high aspect ratio shape. High aspect ratio solder mounds provide more bendability. This can be used to avoid failures caused by a thermal coefficient of expansion mismatch between a semiconductor chip and a substrate to which the chip is mounted in a flip-chip-configuration.

Moreover, quite surprisingly it has been found that when molten solder is injected directly onto a polymer surface, the solder mound when solidified adheres to the surface of a polymer. Therefore, a solder mound transfer support surface can be fabricated from a polymer film without an additional adherent layer. An array of solder mounds can be disposed onto the polymer surface using the apparatus of the present invention. The polymer film can then be disposed over a surface having contact locations thereon aligned to the array of solder mounds on the transfer film. Heat is applied which results in the solder mounds wetting the contact locations. The solder is cooled to solidify it. The polymer film is then peeled away leaving the solder mounds on the substrate contact locations. The polymer films peels away since the adhesion of the solder mounds to the polymer film is less than the adhesion of the solder mound to the contact location.

These and other objects, features and advantages will become more apparent from the following, more detailed description, the appended drawings and the appended claims.

SUMMARY OF THE INVENTION

The broadest aspect of the present invention is a method and apparatus, whereby molten solder is injected into a mold which is disposed in contact with a surface to which the molten solder adheres. The mold is removed leaving a solder mound adhering to the surface.

In a more particular aspect of the present invention, the solder mound has a predetermined shape.

In another more particular aspect of the present invention the solder is solidified before the mold is removed.

In a more particular aspect of the apparatus of the present invention, the apparatus contains a reservoir of molten solder. The reservoir has an output orifice. The apparatus has a mold of predetermined shape. The output orifices of the solder reservoir is in communication with the mold to permit the molten solder to be injected into the mold. There is a means for applying pressure to the molten solder in the reservoir to force the molten solder into the mold. The mold has an output opening which is disposed adjacent a workpiece surface onto which the solder mound is to be deposited.

In a more particular aspect of the present invention, the mold has a plurality of discrete mold cavities arranged in a predetermined array.

In another more particular aspect of the present invention, the mold is formed from a plate of material into an injection plate.

In another more particular aspect of the present invention, the injection plate is slidably mounted onto a support surface to permit filling the plurality of mold cavities with a substantially uniform amount of molten solder.

In another more particular aspect of the present invention the mold plate is formed from a material which is not wetted by molten solder.

In another more particular aspect of the present invention, the mold plate is formed from a single crystal silicon which is etched so that the discrete mold cavities have a crystallographically determined shape such as a truncated pyramid.

In another more particular aspect of the present invention, molten solder is deposited to directly adhere to a polymer surface.

BRIEF DESCRIPTION OF THE DRAWINGS

FIGS. 6, 7 and 8 show a top view of the injection plate on the mold in three different positions.

FIGS. 9, 10 and 11 show the side view of FIG. 4 for the three different positions of FIGS. 6, 7 and 8 respectively, only for the region corresponding to the position of the solder cavity array.

FIGS. 12, 12.5 and 13 show method steps to separate the solder from the mold to form pyramidal shaped solder mounds on a substrate.

FIGS. 19-26 show method steps for injecting solder into cavities in a solder mold wherein the mold is used as a transfer means to transfer the solder mound array to a substrate.

FIGS. 35-37 show method steps for injecting solder into cavities on a tape on reels for making "3D-Decals".

FIGS. 38 and 39 show method steps for transferring solder from "3D-Decals" to fluxed workpieces.

DETAILED DESCRIPTION

Figure 1:
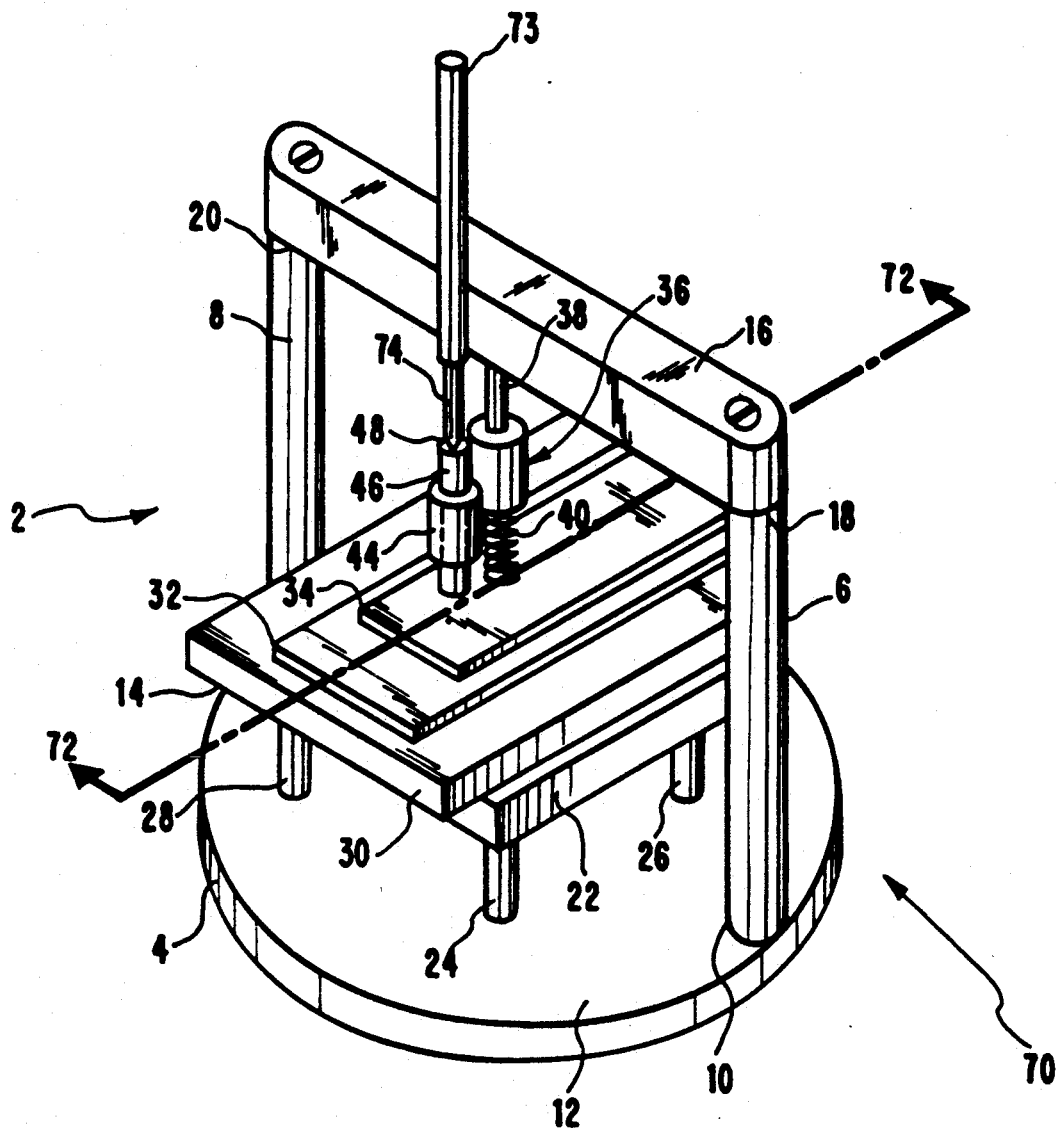
FIG. 1 is a perspective view at a downward angle of an embodiment of the apparatus of the present invention.

FIG. 1 is a perspective view at a downward angle of an embodiment of the present invention. Apparatus 2 has a base 4 on which there are mounted elongated support columns 6 and 8. End 10 of column 6 is fixedly mounted to surface 12 of base 4 and end 14 of column 8 is fixedly mounted to surface 12 of base 4. Base 4 is shown to have circular shape and columns 6 and 8 are at the extreme ends of a diameter of the circle. This design is exemplary only. Columns 6 and 8 project perpendicularly from surface 12. Cross bar 16 is attached at one end thereof to end 18 of column 6 and at the other end thereof to end 20 of column 8. Structures 6, 8 and 16 form an arch. Disposed under the arch is a support platform 22 which is supported by four legs, only 3 of which, 24, 26, and 28, are visible in the view of FIG. 1. Support structure 22 contains a heater which is used to heat the workpiece as described herein below. Disposed on heater base 22 is workpiece support structure 30 which is shown in cross section in FIG. 2. Disposed on the workpiece support structure is mold 32 which is described herein below. Disposed on mold 32 is injection plate or slide 34, the function of which is described herein below. Between cross bar 16 and injection plate 34 there is disposed a means 36 for pressing the injection plate 34 against the mold 32 and correspondingly the mold 32 against the workpiece support plate 30. Means for pressing 36 consist of a means for attachment 38 to the cross beam 16 and a coil spring 40 which is compressed to press against injection plate 34. Disposed on injection plate 34 is solder reservoir tube 46 which is wrapped with heater coil 44 for heating the solder contained in reservoir tube 46 to the molten state. In contact with reservoir 46, shown for example in the form of a tube, there is gas supply tube 74 which at its top end receives gas through hose 73 and which through a temporary O-ring joint at its bottom end is in communication with reservoir tube 46 to permit gas pressure to be applied at orifice 48 of tube 46. The gas is used to force molten solder in reservoir tube 46 into cavities in mold 32 as described herein below.

Figure 2:
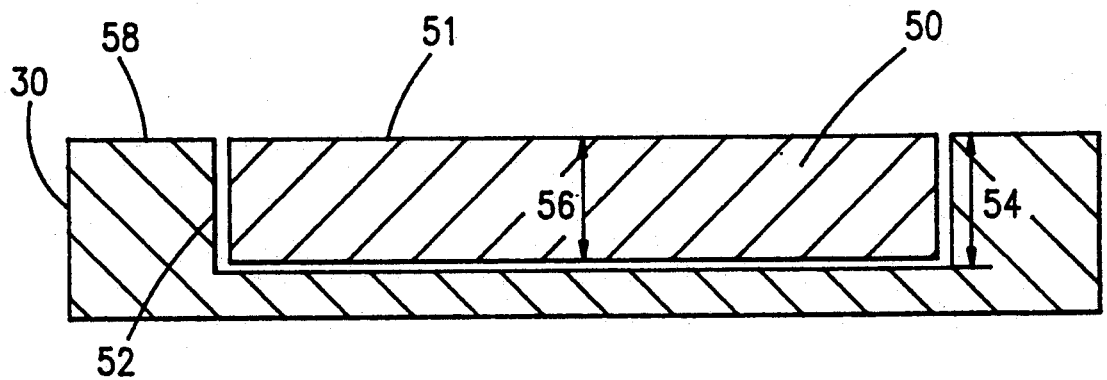
FIG. 2 is a schematic side cross-sectional view through workpiece support structure 30 of FIG. 1.

FIG. 2 shows in cross section substrate support plate 30 having workpiece 50 disposed in a workpiece nest 52 in workpiece support plate 30. The nest 52 height 54 corresponds to the height 56 of the workpiece 50. The nest 52 is to provide an easy means of aligning the workpiece to the apparatus 2 of FIG. 1. The nest 52 is not necessary. The workpiece 50 can be disposed on the surface 58 of the workpiece support plate 30. For simplicity in the remaining Figures the nest 52 is not shown.

Figure 3:
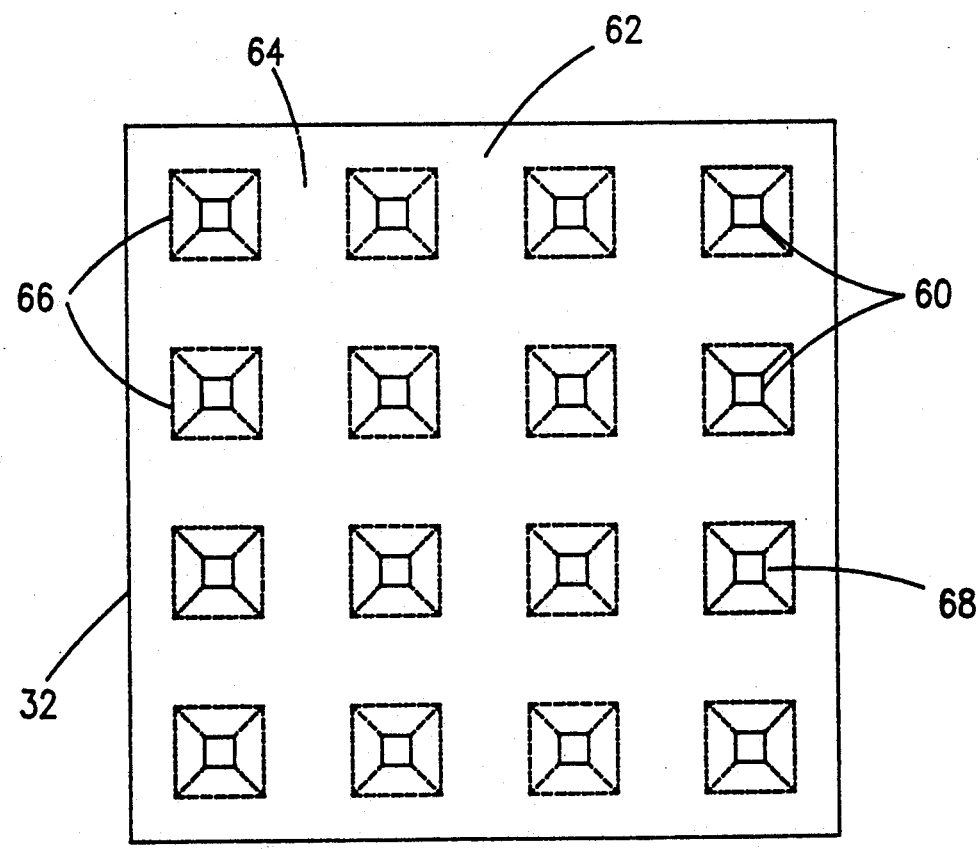
FIG. 3 is a top view of one embodiment of mold plate 32 of FIG. 1 showing the solder cavity array.

FIG. 3 shows a top view of one embodiment of mold 32. Mold 32 has a plurality of apertures 60 on the top surface 62 thereof. These aperture extend through to the bottom surface 64 where they end in aperture 66 having larger dimension than aperture 60. The cavity 68 through mold 32 formed by aperture 60 and 66 is shown to have a pyramidal structure. If the material of the mold 32 is silicon these pyramidal structures can be fabricated by pyrocatachol solution which anisotropically etches along various crystallographic planes in <100> silicon. The cavities 68 form the injection mold cavities for the apparatus of the present invention. Cylindrical shape cavities can be formed in metal such as molybdenum by commonly known selective etch methods.

Figure 4:
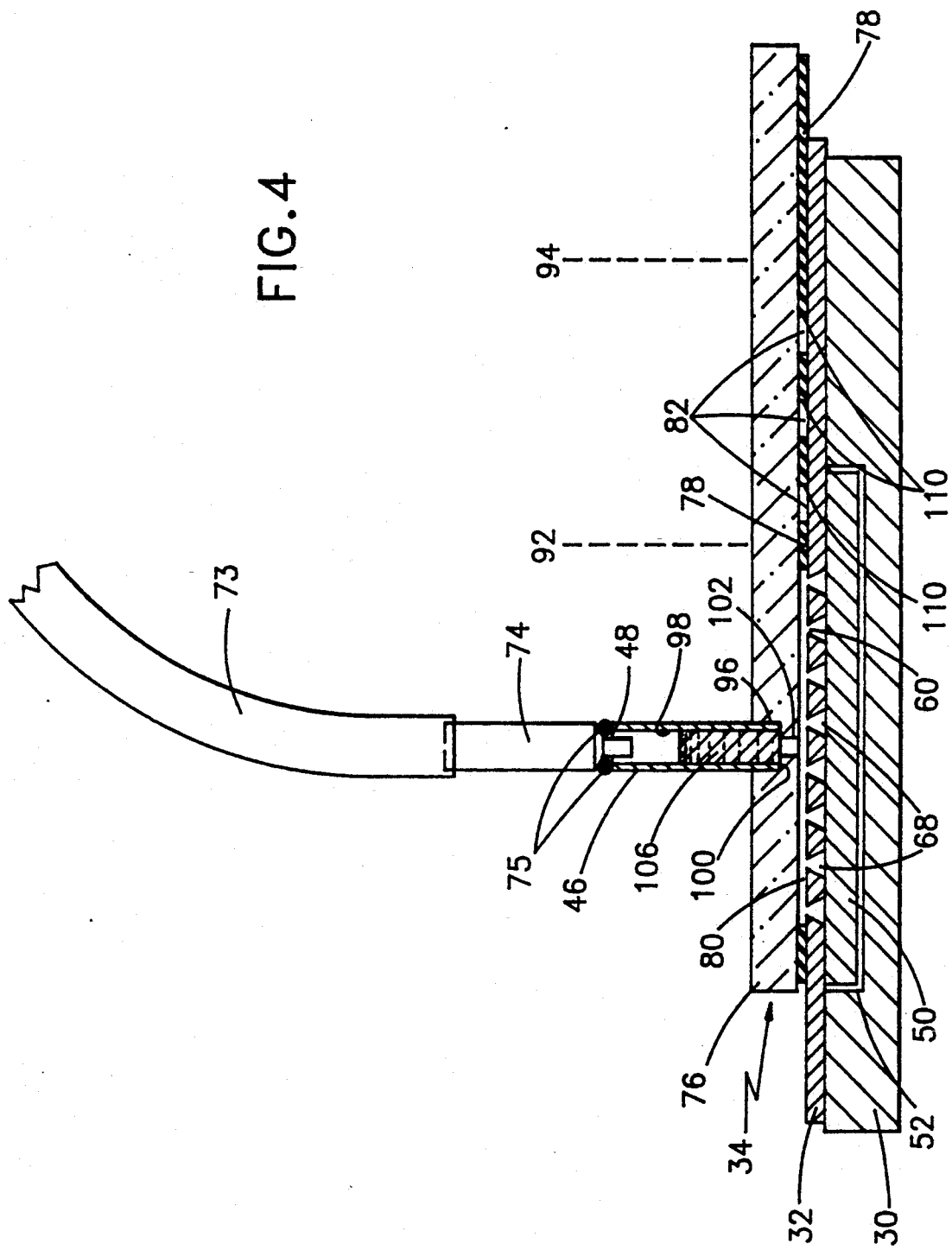
FIG. 4 shows a cross sectional view along lines 72—72 of FIG. 1 through plate 30, mold 32, injection plate 34, solder reservoir tube 46.

FIG. 4 is a side cross section view along the axis 72—72 in direction 70 of FIG. 1. FIG. 4 only shows workpiece support plate 30, mold 32, injection plate 34 and a schematic representation of solder reservoir tube 46 and gas supply tube 74 connected to gas supply hose 73. Through these means compressed air or nitrogen is injected with a low pressure regulator into orifice 48 of tube 46 and temporarily sealed during injection by O-ring 75. Since injection pressures are low, typically a 0-15 psi regulator such as manufactured by Modern Engineering Co. will suffice. Injection plate 34 preferably includes Pyrex (TM) or quartz. In the embodiment of FIG. 4, injection plate 34 is shown as a combination of glass plate 76 and polymer film 78 which is disposed on bottom surface 80 of glass plate 76.

Figure 5:
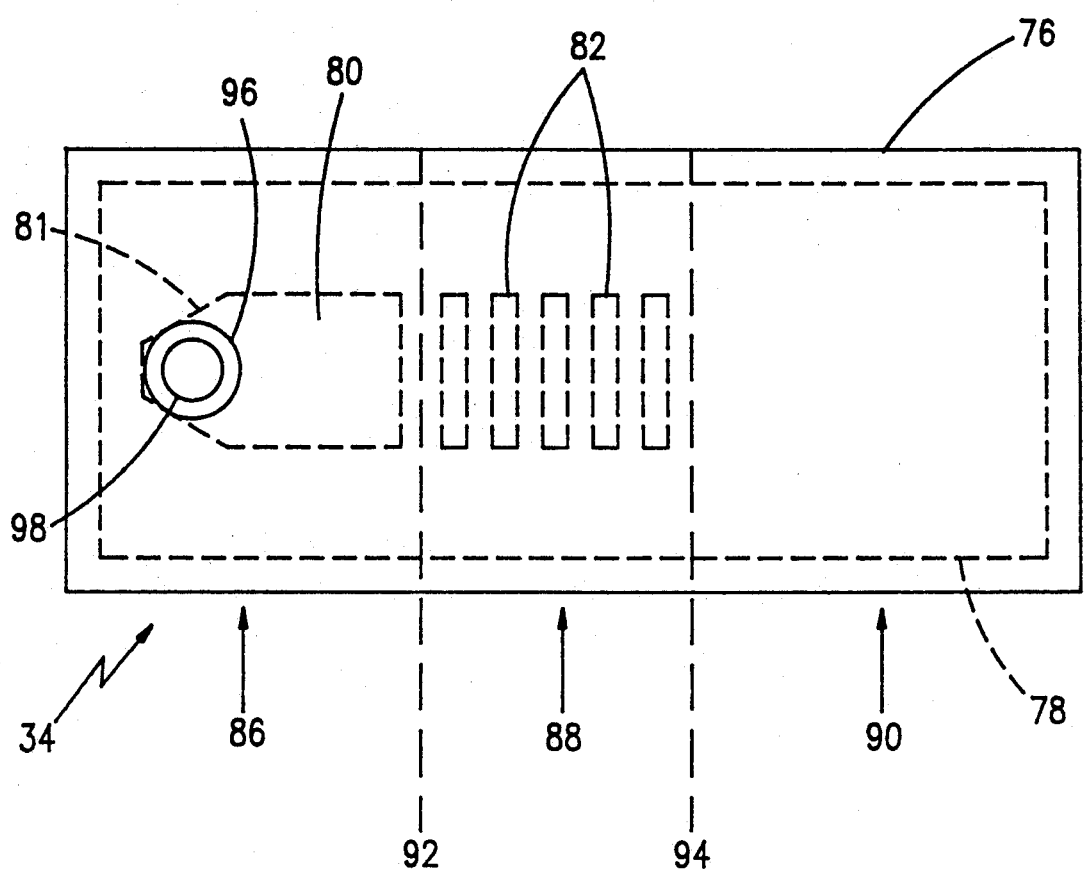
FIG. 5 is a top view of injection plate 34 of FIG. 1.

FIG. 5 shows a top view of injection plate 34. The film 78 has three regions 86, 88 and 90. The dashed lines 92 and 94 represent the imaginary boundaries between these regions. Solder reservoir tube 46 of FIG. 4 and FIG. 1 is inserted into an etched or machined aperture 96 in glass plate 76. The solder reservoir is shown in FIG. 5 to have circular cross section having interior wall 98. As seen in FIG. 4, at the base of the solder reservoir 100 there is an orifice 102 which extends from the base 100 of the solder reservoir tube 46 to the bottom side 80 of glass plate 76. Solidified solder is placed into the solder reservoir tube 46 and by means of heating element 44 of FIG. 1 (which may typically be a Thermofoil (TM) heater made by MINCO) solidified solder is heated to molten solder in the solder reservoir. Because of surface tension and the small cross sectional area of aperture 80, the solder will not spontaneously penetrate into cavity 68. Instead, the liquid solder is forced into cavity 80 by gas pressure means 74.

Referring again to FIG. 5, injection plate 34 has two groups of cavities 80 and 82. These cavities are formed by regions of the polymer layer 78 being selectively removed. The preferred polymer layer is a polyimide, for example, a thin sheet of Kapton tape from which are cut the regions to form cavities 80 and 82. These regions are cut out after the Kapton is adhered onto the bottom surface 80 of glass plate 76. An alternative way of making the cavities 80 and 82 on glass plate 76 is to dispose on one side 70 of glass plate 76 a photo resist material which is selectively developed to form the pattern of cavities 80 and 82. The glass plate can be placed in a glass etchant, such as 50% hydroflouric acid to etch the cavities 80 and 82 directly into the glass plate. These techniques for forming cavities 80 and 82 are exemplary only. It is not necessary for layer 78 to be a polymer. It can be a solder non-wettable metal layer or a dielectric material. Plate 76 does not have to be a glass, it can be another material. Preferably, all surfaces which come into contact with the molten solder should not be wet by the solder, so that the molten solder does not adhere thereto.

FIGS. 6, 7 and 8 show a top view of the injection plate 34 in three positions corresponding to positioning of the three regions 86, 88 and 90 over the array of cavities 68 in mold 32 as shown in FIG. 4.

FIGS. 9, 10 and 11 respectively, correspond to a side view of the injection plate 34 showing only that part of the injection plate which is disposed over the array of cavities 68.

In FIGS. 6, 7 and 8, the array of cavities is shown as rectangle 103 having therein a plurality of dots 104 with each dot 104 corresponding to a cavity 68. In FIG. 6, region 80 which is defined by polygonal shape 81 is disposed over the solder cavity array 103. Referring back to FIG. 4, injection plate 34 is shown in a position corresponding to FIG. 6 and FIG. 9. In FIG. 4, the solder has not yet been injected into cavity 80. The molten solder 106 is forced under gas pressure through orifice 102 into cavity 80 through top opening 60 (as shown in FIG. 4 and FIG. 3) of cavity 68 to fill region 80 and plurality of cavities 68 as shown in FIG. 9. When the plurality of cavities are filled, injection plate 34 is moved in direction 108 as shown in FIG. 7 and FIG. 10. Edge 83 of cavity 80 wipes across the top apertures 60 of cavities 68 wiping away excess molten solder from the top surface 62 of mold 32. As the plurality of apertures 82 pass over the top 62 of the mold 32, the edges 110 (shown in FIG. 4) of the plurality of apertures 82 wipe the top surface of the mold and thereby wipe excess molten solder from the top aperture 60 of the cavities 68. Excess solder is accumulated in cavities 82. FIG. 7 and FIG. 10 show the plurality of apertures 82 disposed above the cavity array 104.

In passing from FIG. 7 to FIG. 8 and correspondingly from FIGS. 10 and 11, the injection plate 34 is moved in the direction of arrow 112 shown in FIG. 8 and FIG. 11 so that region 90 of the injection plate is now disposed over the cavity array 104 as shown in FIG. 8 and FIG. 11. As the injection plate is moved from the positions in FIG. 6 to that of FIG. 7 and to that of FIG. 8, the support plate 22 of FIG. 1 is kept heated so that the solder remains molten as the injection plate is moving over the cavity array 104. After FIG. 8 and FIG. 11 occurs, the apparatus is cooled so the solder solidifies in shapes determined by the cavities 68 of mold 32.

As shown in FIG. 12, injection plate 34 is lifted up in direction of arrow 120. The mold 32 is preferably made of a non-solder-wettable material, such as silicon etched as described herein above, so that the mold can be lifted off in the direction 120 leaving solidified solder mounds 122 as shown in FIG. 13 disposed on surface 124 of workpiece 50. It is necessary to separate the mold away from the solder and workpiece. Therefore, FIG. 12.5 shows pneumatic pressure 123, with higher pressure applied to surface 62 and apertures 60 of mold 32, and lower pressure applied to workpiece 50. The solder mound array, which is disposed on surface 124 can be disposed onto an array of solder wettable contact locations on the workpiece 50. The workpiece 50 can be a semiconductor chip or a semiconductor chip packaging substrate. Quite surprisingly, it has been found that when molten solder is directly disposed onto a polymer surface, in particular a polyimide surface such as a Kapton ® (Dupont) surface, there is some degree of adhesion between the solder mounds 122 and the surface 124 of the polymer. The solid solder mounds 122 on a polymer film 50 can be used as a solder mound transfer means. The vertical pull-strength has been measured in excess of 250 grams for a larger 4 mm diameter solder preform, which translates to about 260 lbs per sq. inch. Alternatively, as shown in FIG. 12, workpiece 50 and mold 32 can be a composite. Workpiece 50 can be made of a rigid solder non-wettable material such as silicon or molybdenum upon which is deposited a dissolvable, patternable material to form mold layer 32. This is processed to produce cavities. An example of such a material is Riston (TM) or other polymers. After injection and solidification, layer 32 can be dissolved away. (Thus FIG. 12.5 does not apply to this embodiment.) More generally, the mold may be sacrificial materials which are dissolvable, friable or otherwise removable. This leaves FIG. 13 with solid solder mounds 122 on solder non-wettable workpiece 50 which can be used as a solder transfer means.

Certain generalizations follow from the above description. The above method could equivalently be realized by keeping a fixed injection plate and moving the mold and workpiece. The movement may be linear or circular. In general it is adequate to have various forms of relative motion between the injection plate 34 and mold plate 32. Furthermore, the injection plate and mold plate may remain fixed, and instead introduce a gate-valve, air-knife, or other means to cause wiping or shear on the top surface 62 of the mold 32.

Figure 14:
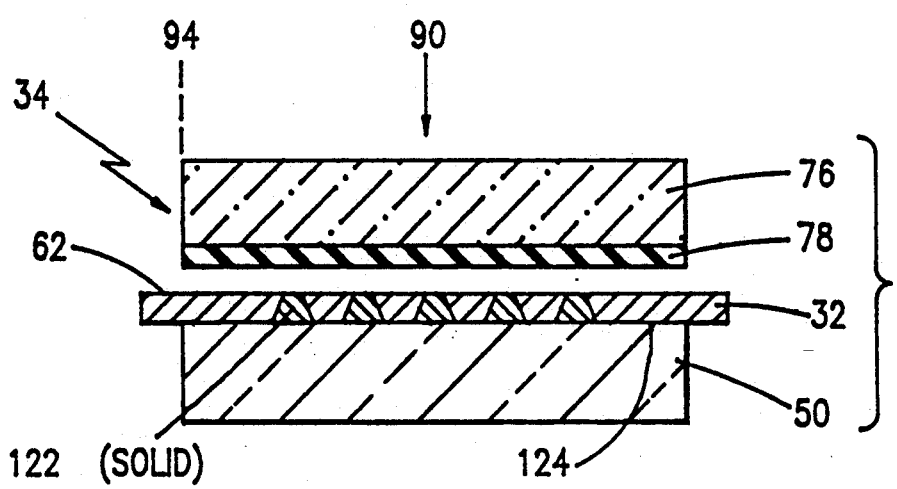
FIGS. 14-18 show method steps for removing the solder array mold when the molten solder is not easily removed from the mold cavities.
Figure 15:
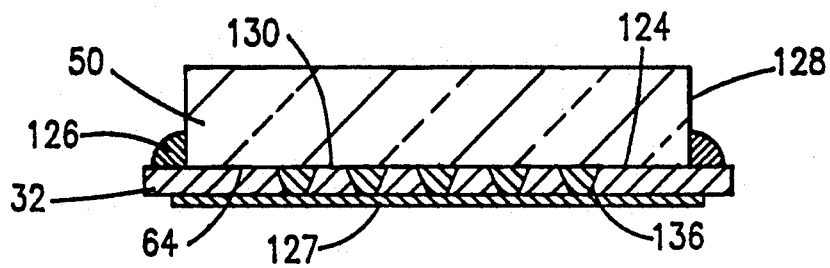
Figure 16:
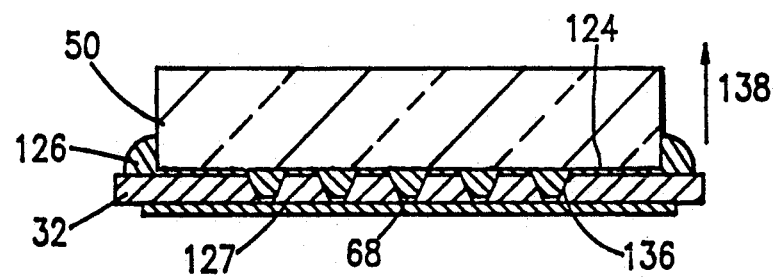

FIGS. 14, 15, 16, 17 and 18 shows a sequence of steps for removing the solder from the apertures 68 of mold 32 when mold 32 is made of a material which is has side walls which are insufficiently smooth to permit the solidified solder mound to be easily extracted therefrom. FIG. 14 is essentially the same as FIG. 12. In FIG. 15 the workpiece 50 in combination with the mold 32 is flipped 180 degrees with respect to FIG. 14. The surface of the mold 32 which is not disposed in contact with workpiece 50 is disposed in contact with a solder non-wettable material 127, which is disposed on a heat source not shown. Flux 126 is disposed about the periphery 128 of the workpiece 50. As heat is applied the flux wicks into the interface 130 between mold bottom surface 64 and workpiece 50 surface 124. The flux reduces the surface oxide on the remelted solder mounds 136. As shown in FIG. 16, by arrow 138, the workpiece 50 rises away from the mold 32 and the solder non-wettable material 127 which is typically molybdenum. Since the solder is now molten and since it adheres to the surface 124 of workpiece 50 and does not adhere to mold 32, the remelted solder mounds 136 are pulled out of the cavities 68 of mold 32 even if the side walls of the cavities are not smooth.

Figure 17:
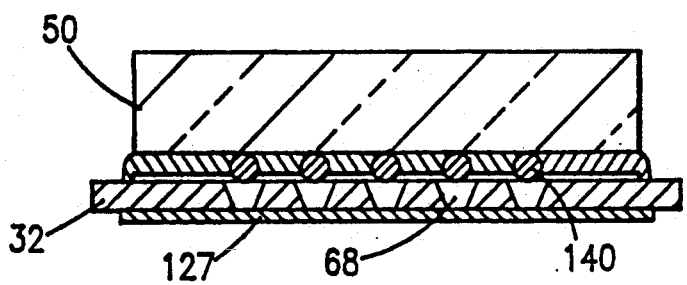

When the remelted solder mounds 136 are fully extracted from the cavities 68 they ball up due to surface tension into spherical shapes as shown in FIG. 17 as 140.

Figure 18:
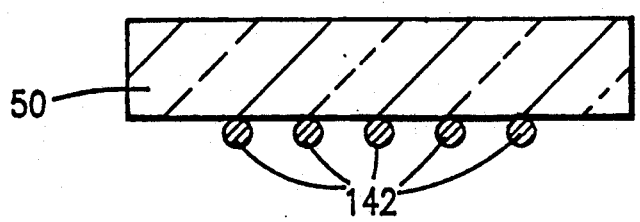

As shown in FIG. 18, the mold 32 and non-wettable surface 127 are removed leaving the workpiece 50 as shown in FIG. 18 having a plurality of sphere like solder mounds 142 which are cooled to form solid solder mounds.

FIGS. 19 through 26, inclusive, show a manufacturing process using the apparatus described herein above to dispose solder mounds onto a substrate such as a semiconductor chip or semiconductor chip packaging substrate. Here the mold-filling steps in FIGS. 19–22 are largely decoupled from the solder-transfer steps in FIGS. 23–26.

FIG. 19 shows a mold 32 having a plurality of apertures 68 therein as described herein above. Mold 32 of FIG. 19 has a bottom surface 144 which has a cavity 146 formed therein adapted for engagement with workpiece 50.

FIG. 20 shows anvil piece 160 which is a non-wettable temporary substitute for workpiece 50 of FIGS. 9–13. Also shown is mold 32 with the cavity 146 disposed over and in alignment with anvil piece 160 which is in contact with the lower apertures 66 of cavities 68. FIG. 20 shows injection plate 34 with molten solder being injected into cavity 80 as described herein above to fill cavities 68 of the mold 32.

In FIG. 21, as described herein above, injection plate 34 is slid over the mold 32 so that wiping apertures 82 pass thereover. As shown in FIG. 22 injection plate 34 and mold 32 have been removed. In FIG. 20 and 21 anvil piece 160 is preferably glass. At the step shown in FIG. 21, an optical observation can be made since all components are optically transparent except for the molten solder. Layer 76 of the injection plate 34 is preferably glass. Layer 78 of the injection plate 34 is preferably a transparent polyimide. The mold 32 is of an opaque material. Since anvil piece 160 is preferably glass, if light is shined from side 152 of anvil piece 160, an optical observation can be made from side 154 of injection plate 34. If light passes there through, it will have to pass through an unfilled aperture 68. If any of the apertures are unfilled, the process flow can return to the step of FIG. 20 to inject again molten solder 106 to fill the unfilled cavity 68. The solder is cooled leaving solidified solder 122 filling cavities 68.

In FIG. 22 anvil piece 160 has been removed as shown by arrow 156.

In FIG. 23, the mold 32 containing the solidified solder 122 filling the cavities 68 is disposed and aligned over a workpiece 50 having a layer of flux 162 thereon.

As shown in FIG. 24, the workpiece 50 is inserted into cavity 146 of mold 32. Thus, the flux layer 162 is brought into contact with aperture 66 of cavity 68 which opens up into cavity 146 of mold 32. The plurality of cavities 68 containing solder 122 can be aligned to predetermined locations on the workpiece 50 such as contact pads on a semiconductor chip. The solidified solder 122 in the apertures 68 of the mold 32 is remelted. The flux layer 162 results in the reduction of a surface oxide on the solder and on any contact pads on the workpiece 50. The molten solder then wets the surface of the contact locations which can be a gold surface.

As shown in FIG. 25, the mold 32 rises from the workpiece 50 in the direction 170. When the molten solder comes out of the mold cavities 68, it beads up into a spherical shape as molten solder mounds 140. The solder is allowed to cool to form solid solder balls 142 on workpiece 50 as shown in FIG. 26, which is shown with mold 32 already removed.

Some applications need free preformed solder mounds, especially balls with accurately controlled volume. One application is solder balls to rework solder arrays produced by less reliable processes. These balls can be produced with high quality and low cost by the apparatus and method of this invention, with a slight modification of that shown in FIG. 19-26. After FIG. 22, orient the mold so its second surface (with the wide end of the cavities) is on top. In contrast to FIG. 23, do not apply a workpiece. Instead during the process steps shown in FIGS. 24-26 the balls form free under the influence of flux, resting upon the wide apertures of the cavities. Once the balls have solidified, and the flux has been cleaned away, then apply an alternative workpiece with low-tack adhesive (such as plastic tape with cured rubber adhesive) which will safely carry an array of individual balls. Alternatively, pour loose balls from the mold into a container.

Figure 31:
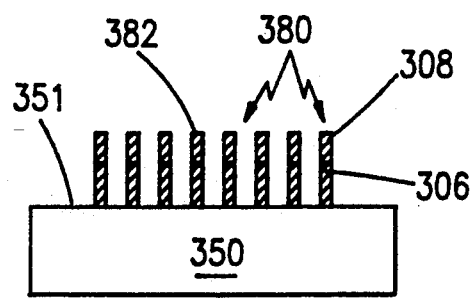
Figure 32:
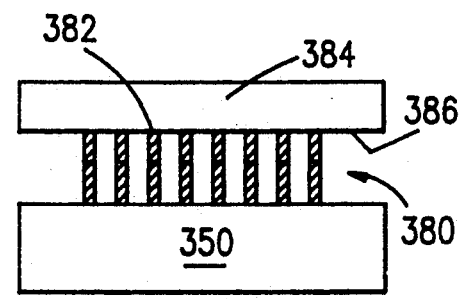
Figure 33:
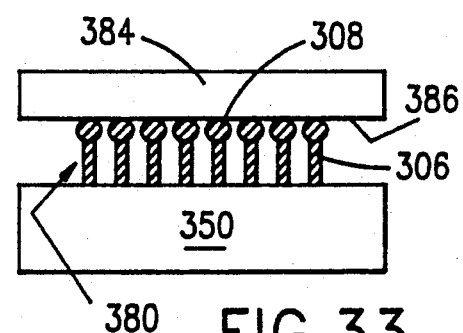

FIGS. 27 through 33 inclusive show a method using the apparatus of the present invention to fabricate a solder mound having multiple solder alloys with various melting temperatures. This provides a solder mound which is tall and slightly bendable like a pin, but nevertheless is adherent and readily fabricated, like the solder mounds described above. In FIG. 33, there is a first workpiece 350 and a second workpiece 384 which are electrically connected by solder mounds 380. Each solder mound 380 includes a tall sub-mound 306 of solder with a high melting-point, and a sub-mound 308 of solder with a low melting-point. The low melting-point sub-mound is remelted to electrically connect to pads on workpiece 384, and the high melting-point sub-mound provides the tall pin that is not remelted. The unequal melting-points allow melting one without melting the other.

Figure 27:
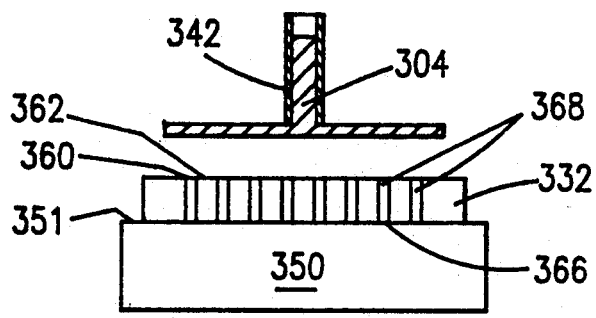
FIGS. 27-33 show method steps for forming high aspect ratio solder mounds having layers of solder with different melting points.

An analogous structure, apparatus and method can provide solder mounds with three or more sub-mounds with distinct melting-points. The apparatus of the present invention is schematically represented by solder deposition apparatus 302 in FIGS. 27-30. In FIG. 27 the solder reservoir 342 contains a high melting point molten solder 304, for example, 95/5 Pd/Sn having a melting point of about 310 C. Mold 332 having mold cavities 368 therein is disposed onto surface 351 of workpiece 350. The workpiece can be a semiconductor chip or packaging substrate. Cavity 368 has an upper aperture 360 and a lower aperture 366. The lower apertures 366 can be aligned with contact locations on surface 351 of workpiece 350.

Figure 28:
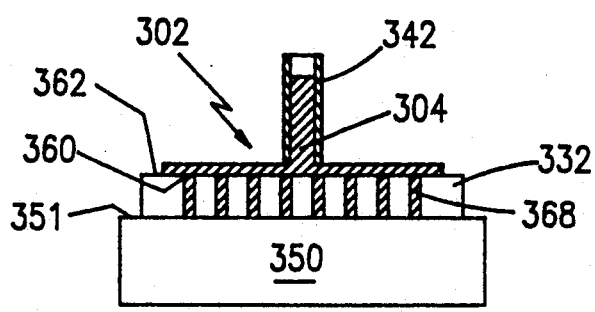

In FIG. 28 the solder molding apparatus 302 is brought into contact with surface 362 of mold 332 and as described herein above, the solder is injected into the cavities 368 and the wiping method previously described is used to separate the molten solder in cavities 368 from the molten solder in molding apparatus 302. The solder is allowed to cool and the solder mold apparatus 302 is removed, leaving the mold 332 containing solidified solder within the cavities 368.

Figure 29:
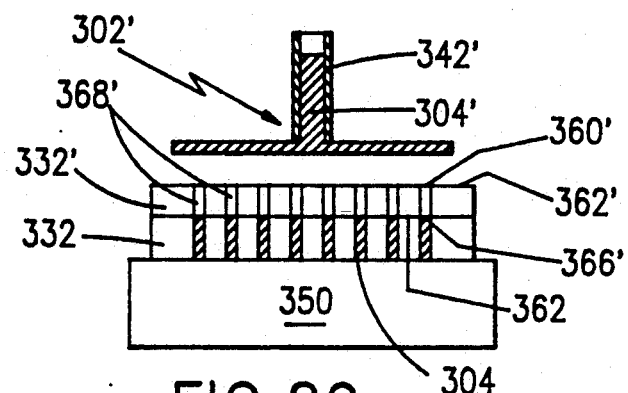

In FIG. 29 a second mold 332' is disposed onto surface 362 of mold 332. Mold 332' has cavities 368' therein. Cavities 368' have upper apertures 360' and a lower apertures 366'. The lower apertures 366' are aligned with the upper apertures 360 of cavities 368 of mold 332. The solder injection apparatus 302' is disposed over surface 362' of mold 332'. Apparatus 302' has reservoir 342' containing liquid solder 304' having a lower melting temperature than the solder 304 of FIGS. 27 and 28. The lower melting point solder can be eutectic solder having a composition of 37/63 Pb/Sn having a melting temperature of 183° C.

Figure 30:
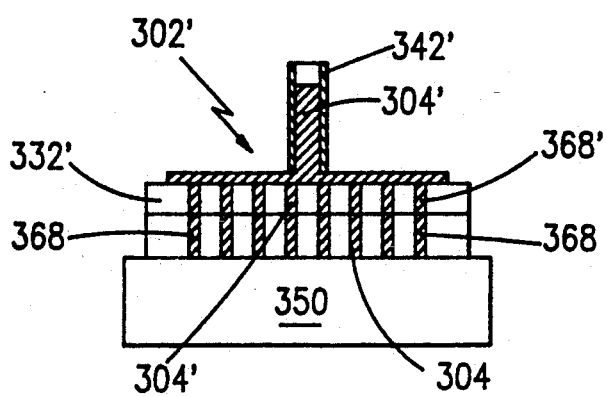

As shown in FIG. 30 the low melting point molten solder 304' is injected into cavities 368' of mold 332'.

As shown in FIG. 31, mold 332' and 332 are removed. These molds can be removed using the techniques described herein above, including differential pressure on solidified solder in slightly tapered, smooth-walled cavities. Mold removal may also be accomplished by having dissolvable or multi-part molds. Alternatively, the solder volume in mold cavities may be slightly reduced by a flux-activated method to remove a controlled solder volume. This causes the solder in the cavities to slightly recede from the mold walls thus allowing mold removal. However, this method can only be used after the process steps shown in FIGS. 28 and 30 since the solder must be molten. A plurality of high aspect ratio (ratio of height to cross section dimension) solder mounds 380 are disposed on surface 351 of workpiece 350. The solder mounds 380 have a lower portion 306 of high melting point solder and an upper portion 308 of lower melting point solder. Although only a solder column is shown having two different types of melting point solder, any number of layers of solder having different melting temperatures can be fabricated using the techniques described herein. Each solder column 380 has an exposed end 382. As shown in FIG. 32, a second workpiece 384 is disposed over the plurality of elongated solder columns 380. The second workpiece 384 can be semiconducting chip having semiconductor chip contact locations on surface 386 which are aligned with and placed in contact with ends 382 of the elongated solder columns 380.

The structure of FIG. 33 can be heated to the melting temperature of the low melting point solder 308. The surface 386 can be solder wettable, such as gold plated chip contact locations. Flux can be applied to reduce surface oxide on the molten solder and contact locations. The molten solder 308 will wet the contact locations. Upon cooling the molten solder 308 will solidify, resulting in an unremelted high melting point solder column 306 having a low melting point sphere shaped solder ball at the end which is bonded to the chip contact locations on surface 386 of workpiece 384.

Figure 34:
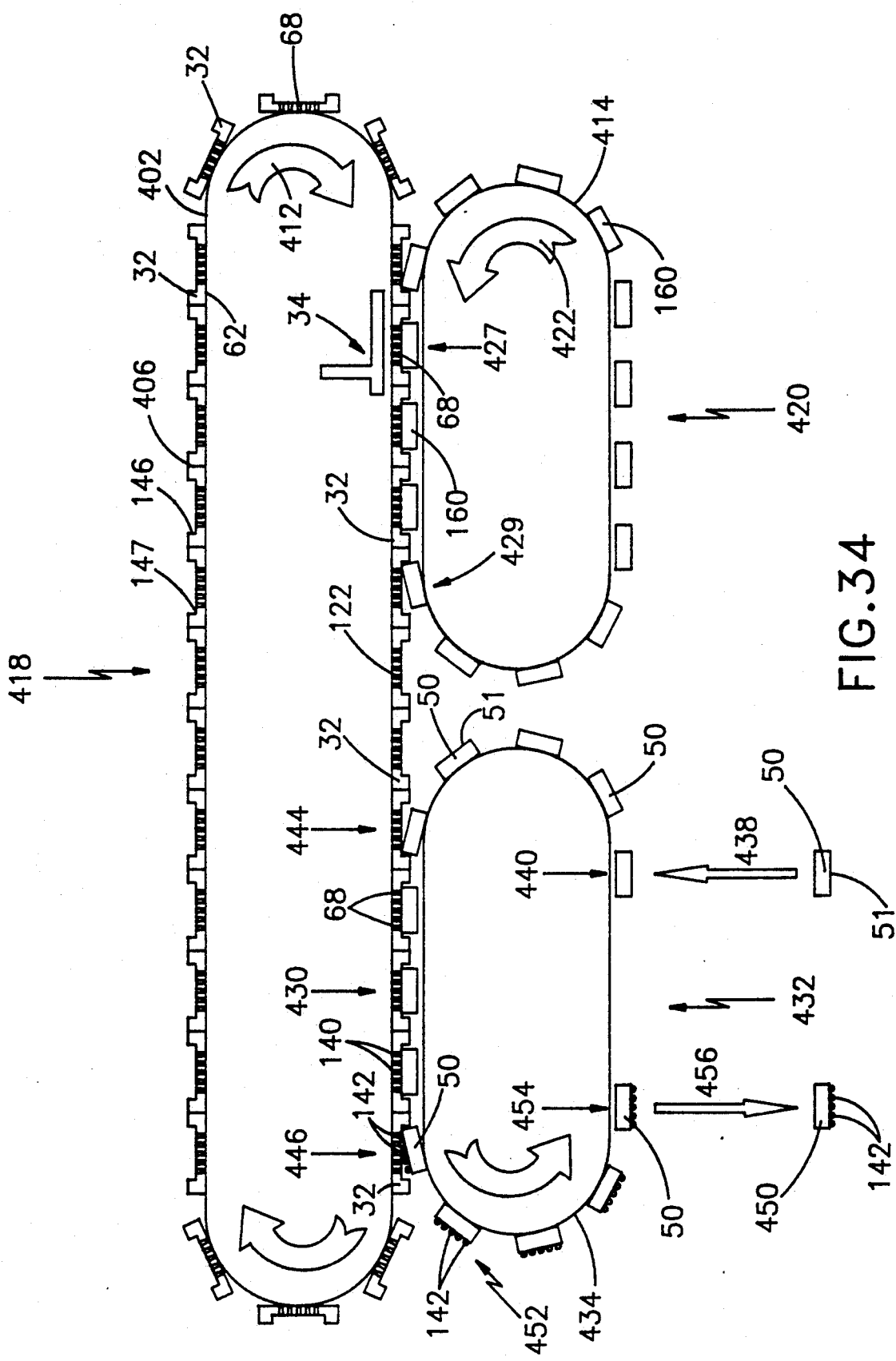
FIG. 34 shows an automated manufacturing system for disposing an array of solder mounds onto a substrate.

FIG. 34 shows an automated manufacturing process using the apparatus and methods described herein above with reference to FIGS. 19-26. On conveyor track 402 there are disposed a plurality of molds 32 each of which is abutted against an adjacent mold as shown at 406. Each mold has a plurality of cavities 68. Each mold has a central accommodating cavity 146 as described herein above with reference to FIG. 19. Conveyor belt 402 is shown to circulate in a clockwise direction 412. Conveyor belt 414 contains a plurality of anvil pieces 160 as described herein above with reference to FIGS. 20-22. The anvil pieces provide a surface against which to dispose the mold while injecting molten solder into the mold cavities. Accommodating cavity 146 of mold 32 has dimensions to accommodate the anvil pieces on loop 420. Loop 420 rotates in a counter clockwise direction as indicated by arrow 422. As loop 418 rotates in a clockwise direction, and as loop 420 rotates in a counter clockwise direction a plurality of anvil pieces 160 come into engagement with the accommodating cavities 146 of the molds 32. The cavities 68 extend from the base 147 of the accommodating cavity 146 through to the opposite surface 62 of the molds 32. At location 427 an injection molding apparatus as described herein above and schematically shown as element 34 is disposed over a anvil piece 160 engaged with a mold 32. Apparatus 34 forces molten solder into the plurality of cavities 68 of mold 32 at location 427 as described with reference to FIGS. 20 and 21. As circulating 418 and 420 loops advance, the anvil piece 160 and mold 32 are pulled away from each other as shown in position 429 and described with reference to FIG. 22. Also, as described herein above, the anvil piece can be a glass substrate to which the solder mounds do not adhere strongly. Between locations 427 and 430 the apertures 68 of molds 32 are filled with solidified solder 122. Loop 432 has a conveyor belt 434 which picks up a workpiece 50 as indicated by arrow 438 at location 440. Conveyor 434 rotates in a counter clockwise direction so that surface 51 of workpiece 50 engages with the accommodating cavity 146 of mold 32 and so that surface 51 of workpiece 50 contacts surface 147 of the base of the accommodating cavity 146 at location 444 as described with reference to FIGS. 23 and 24. Between locations 444 and 430 heat is supplied. Flux is either supplied as described with reference to FIG. 15, or the workpiece 50 has on surface 51 a layer of flux 162 as described with reference to FIGS. 23-25. The reflowed solder 140 adheres to solder wettable contact locations on surface 51 which correspond with the locations of the solder filled cavities 68. Between locations 430 and 446, molten solder 140 solidifies into solder balls 142. At location 446 the workpiece 50 is pulled away from the mold 32. As described with reference to FIG. 26, the solidified solder is pulled out of the mold as solder balls 142 shown at location 452. At location 454 the workpiece 50 is removed as indicated by arrow 456 from conveyor 434 to be a finished workpiece 450 having a plurality of solder balls 142 on the surface thereof.

It will be apparent to those of skill in the art that if an elongated solder mound having different layers of solder of different melting temperature are desired that a second intermeshing loop or a plurality of intermeshing loops can be added to the general automated scheme of FIG. 34 to achieve such a structure. FIGS. 35-39 show how this overall apparatus, method and process can be fruitfully divided into two sectors. The first sector (FIGS. 35-37) makes a mold filled with solder, as shown in FIGS. 19-22. The second sector (FIGS. 38 and 39) transfers solder from this mold to a substrate or other product, as shown in FIGS. 23-26. These sectors are connected only by molds filled with solder, and possibly by empty molds awaiting refill. Depending on the application, these sectors may be tightly or loosely coupled. For example, FIG. 34 shows loop 418 tightly coupling loop 420 and loop 432. In other applications, these two sectors can be loosely coupled. For example, FIGS. 35-39 show how these two sectors may be remote in time and location. FIGS. 35 and 36 show injection plate 34 filling empty mold-decal tape 504 with solder to become solder-filled mold-decal tape 506. Thus the reel of empty mold-decal tape 508 becomes the reel of filled mold-decal tape 510. The anvil base 502 provides a non-wetting surface against which molten solder 106 is injected by injection plate 34. After each mold-decal 32 containing cavities 68 is filled by the apparatus and methods described with reference to FIGS. 19-22, the tape advances to the next empty mold-decal in direction 512. Thus the molds filled with solder are autonomous components indicated by reel 510 holding tape 506. (We propose the names "Solder Three Dimensional Decal", or "Solder Solid Decal", with shorter forms "Solder Three-D Decal", "Solder Three-Decal", "Solder Solid Decal", "Three-Decal", "3-Decal" with corresponding permutations, abbreviations and acronyms.) 3-Decals are autonomously accumulated and transferred between sectors. 3-Decals are autonomously used to apply patterned solder to a product. 3-Decals are applied like solder decals in certain other solder processes. However 3-Decals can convey a significant three-dimensional structure for the solder. Two examples are the pyramids and the dual-alloy columns described above. In the prior art by contrast, solder decals convey largely two-dimensional structure, with minimal perpendicular structure.

An embodiment of 3-Decal is well suited to efficient mass production, in analogy to Tape Automated Bonding or T.A.B. FIG. 35 shows a reel, containing a tape 504, containing molds with an array of cavities, which are filled with solder. One example of the process is as follows. A long tape of polyimide, or other high temperature plastic, or plastic superimposed with metal such as molybdenum, is wound upon a reel. For high temperature alloys, the tape can be a thin foil, with superimposed metal molds. This tape could have sprocket holes and frames according to the standard for Tape Automated Bonding. Second, in each frame of this tape, make an array of cavities 68 with predefined geometry, including cavity location, volume and shape. This could use punching or etching processes. As shown in FIG. 37, each mold frame 32 may either contain through-hole cavities 68 in empty tape 504 and 68' in filled tape 506, or each mold frame 33 may contain blind-hole cavities 69 in empty tape 505 and 69' in filled tape 507. Dividing lines 406 and 407 show the ends of each mold frame 32 or 33 in continuous tape 504 (506 filled) and 505 (507 filled). Also, a previous reel of tape may be reused. Third, fill the cavities 68 with solder. Both cavity fabrication and solder filling can be done as reel-to-reel process. This makes a tape of 3-Decals.

FIG. 38 shows reel 510 and tape 506 of filled 3-Decals. FIG. 39 shows arrows 514 and 516 which indicate the direction of movement of what could be another reel and tape which carry components 50. The two reels and tapes are gradually unwound. Each component is successively aligned with a 3-Decal at position 518. Alignment apparatus and methods may include targets for split-optics, mechanical alignment features or additional alignment holes through the mask. The solder array is transferred by means described with reference to FIGS. 23-26 and shown in positions 520 and 522. At position 524 the workpiece tape separates from the 3-Decal tape as transfer is completed. Finally, the tape of empty molds is rewound upon another reel and preferably recycled. (We propose the name "Tape Automated Soldering" and acronym TAS for this reel and tape version of the 3-Decal process.) The preferred embodiment of this invention has both microscopic and macroscopic aspects. Microscopic aspects are shown in FIGS. 19-22, which makes a 3-Decal, followed by FIGS. 23-26, which transfers this solder to a workpiece. Macroscopic aspects are a TAS-like embodiment, as shown in FIGS. 34-39. In general, this apparatus and method is applicable to a wide variety of solder alloys and melting points. For each alloy, the materials of the apparatus must be chosen to withstand its melting temperature, and to have suitable non-wetting/wetting properties. This invention has been practiced successfully with many alloys including: SnPb (eutectic 183 C), BiSn (eutectic 138 C), BiPb (eutectic 124 C), InSn (eutectic 118 C), BiIn (eutectic 109 C), InBi (eutectic 72 C), BiPbInSn (liquidus 69 C).

Many embodiments have been repeatedly achieved. A partial list is as follows. The apparatus and method of FIG. 6 through FIG. 11 was used to inject solder into a molybdenum mold. Then the apparatus and method of FIG. 14 through FIG. 18 was used to transfer this to a workpiece that was a small ceramic wiring substrate with metal terminal pads. The result was a nicely uniform array of good quality solder balls upon pads upon ceramic. The solder was 63% Sn, 37% Pb, and the geometry was: ball diameter=0.250 mm, pad diameter 0.150 mm, array pitch=0.450 mm, mounds in array=1738.

The apparatus and method of FIG. 1 through FIG. 13 was used with a silicon mold with pyramidal cavities. The workpiece was a polyimide sheet with gold metal pads. The result was a uniform array of solder pyramids with good adhesion to the pads. The geometry was approximately: pyramid width=0.175 mm, pyramid depth=0.175 mm, width of injection aperture at apex of pyramid=0.012 mm, array pitch=0.225 mm, mounds in array=over 1000. In another example, the workpiece was an uncoated piece of polyimide sheet, and the same mold was used. The resulting solder pyramids had significant adhesion to the workpiece, with good uniformity and quality. An array of free solder balls was fabricated by the apparatus and method of FIG. 19 through FIG. 26, with modifications as described in the above specifications. This array was picked up by a tape with low tack adhesive. The same silicon mold was used. The resulting balls had notably uniform solder volume.

In summary, an apparatus and method for injection molding discrete mounds of solder in predetermined locations on a workpiece has been described. The workpiece, in particular, may be a semiconductor chip or a semiconductor chip packaging substrate having on a surface thereof an array of electrical contact locations onto which solder mounds, as described herein, are to be disposed. An automated apparatus and process for depositing the solder mounds onto such substrates has been described using intermeshing conveyor belt loops to provide a completely automated apparatus and process for disposing solder mounds onto electronic devices. A more advanced embodiment is a reel-to-reel apparatus and process for Tape Automated Soldering.

We claim:

1. An apparatus for injection molding molten solder comprising:
   a reservoir for said molten solder;
   said reservoir having an output orifice;
   a mold having at least one cavity;
   said output orifice is in communication with said mold to permit said molten solder to be injected into said at least one cavity;
   means for removing excess molten solder from said mold; and
   means for applying pressure to force said molten solder into said at least one cavity.

2. The apparatus of claim 1, wherein said mold has a first and second surface and wherein said at least one of cavity extend from said first to said second surface.

3. The apparatus of claim 2, further comprising a workpiece which is disposed against said second surface.

4. The apparatus of claim 3, further including a workpiece holding means.

5. The apparatus of claim 4, wherein said workpiece holding means has a cavity for receiving said workpiece.

6. The apparatus of claim 3, further including a means for heating said workpiece.

7. The apparatus of claim 3, wherein said workpiece is selected from the group consisting of a semiconductor chip, a semiconductor chip packaging substrate and a polymer body.

8. The apparatus of claim 3, further including means for removing said workpiece with a plurality of solder mounds disposed on a surface thereof in an arrangement corresponding to an array of said at least one cavity in said mold.

9. The apparatus of claim 8, wherein said removed workpiece is a polymer body having said solder mounds adhered directly to said body.

10. The apparatus of claim 1, wherein there are a plurality of cavities in said mold.

11. The apparatus of claim 1, further including a heater element to melt solid solder to said molten solder.

12. The apparatus of claim 1, further including a means for heating said molten solder in said at least one cavity.

13. The apparatus of claim 1, further including a means for controlling said pressure.

14. An apparatus for injection molding solder comprising:
   a reservoir for said molten solder;
   said reservoir having an output orifice;
   a mold having at least one cavity;
   said output orifice is in communication with said mold to permit said molten solder to be injected into said at least one cavity;
   means for applying pressure to force said molten solder into said cavities;
   said mold has a first and second surface and wherein said at least one cavity extend from said first to said second surface;
   an injection plate which is adapted to move with respect to said first surface of said mold, said injection plate comprising:
   a first injection plate side;
   a second injection plate side;
   an injection cavity opening to a first region of said second injection plate side;
   said injection cavity having an edge at said second injection plate side; and
   said output orifice of said reservoir being in fluid communication with said injection cavity.

15. The apparatus of claim 14, further including a means for moving said injection plate from a first location to a second location wherein at said first location said injection cavity is disposed over said at least one cavity so that when said pressure is applied by said means for applying pressure, said molten solder is forced into said injection cavity and therefrom into said at least one cavity and so that when injection plate is moved to said second location said edge of said injection cavity wipes away said molten solder at said first surface of said mold in the vicinity of said at least one cavity.

16. The apparatus of claim 15, further including a wiping cavity opening to a second region of said second slide plate side, said wiping cavity has an edge, so that when said slide plate is moved from said first location to said second location said edge of said wiping cavity wipes away said molten solder at said first surface of said mold in the vicinity of said at least one cavity.

17. The apparatus of claim 16, wherein there are a plurality of wiping cavities.

18. An injection molding apparatus for disposing solder as mounds on a workpiece surface comprising:
a reservoir for said solder;
means for heating said solder to molten solder;
said reservoir has an output orifice;
a mold having a plurality of cavities in a predetermined array;
said mold having a first substantially planar surface and a second substantially planar surface;
said cavities extend from said first surface to said second surface;
an injection plate adapted to move with respect to said first surface;
means for applying pressure to said molten solder;
means for controlling said pressure;
said injection plate having a first injection plate surface, a second injection plate surface, an injection cavity having an edge at said second injection plate and a wiping cavity having an edge at said second injection plate side;
said output orifice of said reservoir being in fluid communication with said injection cavity;
means for moving said injection plate from a first location to a second location;
at said first location said injection cavity is disposed over said array of cavities so that when pressure is applied by said means for applying pressure said molten solder is forced into said injection cavity and therefrom into said array of cavities;
when said injection plate is moved from said first location to said second location, said wiping cavity wipes away excess molten solder at said first surface of said mold in the vicinity of said array;
a workpiece holding means for holding said workpiece adjacent said second surface of said mold; and
a means for heating said workpiece.

19. An apparatus for injection molding solder comprising:
a molten solder reservoir means;
a molding means;
said molding means is in operative communication with said molten solder reservoir means;
means for applying force to force said molten solder into said mold; and
means for removing excess molten solder from said molding means.

20. An apparatus for injection molding molten solder comprising:
a reservoir for said molten solder;
said reservoir having an output orifice;
a mold having at least one cavity;
said output orifice is in communication with said mold to permit said molten solder to be injected into said at least one cavity;
means for applying pressure to force said molten solder into said cavities;
a plurality of said molds;
a mold conveying means for transporting said plurality of said molds;
a support substrate conveying means for transporting a plurality of support substrates;
a workpiece conveying means for transporting a plurality of workpieces;
said mold conveying means coacting with said support conveying means so that one of said supports coacts with one of said molds to provide a surface for injection molding molten solder into said one of said molds against said support to form a mold filled with solder;
said mold conveying means coacting with said workpiece conveying means so that said mold filled with said solder is disposed against said workpiece and transferred thereto.

21. A method comprising:
providing a mold having at least one cavity extending from a first surface to a second surface of said mold;
disposing said cavity at said second surface adjacent to a surface of a workpiece;
forcing molten solder into said cavity from said first surface of said mold;
removing excess molten solder from said mold;
removing said mold leaving a solidified solder mound on said surface.

22. The method of claim 21, wherein said solder contains a material selected from the group consisting of Pb, Sn, Bi and In.

23. An apparatus for injection molding of solder into a predefined geometry, which apparatus comprises:
means to supply molten solder;
a mold with plural cavities with predefined geometry;
means to force said molten solder into said cavities;
means for removing excess molten solder from said mold; and
means to separate said solder within said cavities from said molten solder.

24. The apparatus of claim 23, wherein said cavities have interior surfaces which are not wettable by molten solder, said force means is pneumatic pressure applied to said molten solder, said separation means is means to wipe or shear away solder external to said cavity, further including means to convey said molten solder from said supply means to said mold cavities, means to freeze said solder within said cavities.

25. The apparatus of claim 23 further comprising means to hold a workpiece closely adjacent to said mold and in communication with said cavities, and means to cool said solder to form mounds of solder adhered to said workpiece.

26. The apparatus of claim 25, further including means to separate said mold with said cavities away from said workpiece with said solder mounds.

27. The apparatus of claim 26, wherein said mold has first and second surfaces, and said cavities extend between said first and second surfaces.

28. The apparatus of claim 26, wherein said means to separate creates a pressure difference: high pressure said solder mounds, low pressure upon said workpiece.

29. The apparatus of claim 26, wherein said means to separate includes a flux.

30. The apparatus of claim 25, wherein said workpiece is an electronic component with terminals of adherent metal at predetermined locations.

31. The apparatus of claim 25, wherein said workpiece is selected from the group consisting of a semiconductor chip, a packaging substrate for plural semiconductor chips, a polymer body, a ceramic body, a metallic body.

32. The apparatus of claim 25, wherein said workpiece is a polymer body having solder mounds directly adhered to this body.

33. An apparatus for injection molding of solder into a predefined geometry, which apparatus comprises:
   means to supply molten solder;
   a mold with plural cavities with predefined geometry;
   means to force said molten solder into said cavities;
   means to separate said solder within said cavities from said molten solder;
   said cavities have interior surfaces which are not wettable by molten solder, said force means is pneumatic pressure applied to said molten solder, said separation means is means to wipe or shear away solder external to said cavity, further including means to convey said molten solder from said supply means to said mold cavities, means to freeze said solder within said cavities;
   wherein said means to convey is an injection plate adapted to flow molten solder from said supply to said mold cavities, said separation means provides relative motion between said mold and an adjacent member.

34. An apparatus for injection molding molten solder on a workpiece comprising:
   a mold having at least one cavity extending from a first surface to a second surface of said mold;
   said cavity at said second surface being disposed adjacent to a surface of said workpiece;
   means for forcing molten solder into said cavity from said first surface of said mold;
   means for removing excess molten solder from said mold;
   means for removing said mold leaving a solidified solder mound on said surface.

35. The method of claim 34, wherein said solder contains a material selected from the group consisting of Pb, Sn, Bi and In.

* * * * *